(12) United States Patent
Weimer et al.

(10) Patent No.: US 6,576,979 B2
(45) Date of Patent: Jun. 10, 2003

(54) USE OF SELECTIVE OXIDATION CONDITIONS FOR DIELECTRIC CONDITIONING

(75) Inventors: Ronald A. Weimer, Boise, ID (US); Don Carl Powell, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/062,123

(22) Filed: Jan. 31, 2002

(65) Prior Publication Data

US 2002/0096745 A1 Jul. 25, 2002

Related U.S. Application Data

(62) Division of application No. 09/652,751, filed on Aug. 31, 2000.

(51) Int. Cl.[7] ............................................. H01L 23/58
(52) U.S. Cl. ..................... 257/629; 257/629; 257/347; 438/255
(58) Field of Search ................................. 257/629, 347; 438/255, 660, 585; 437/40

(56) References Cited

U.S. PATENT DOCUMENTS

| | | | |
|---|---|---|---|
| 4,090,289 A | 5/1978 | Dennard et al. | |
| 4,914,497 A | 4/1990 | Kondo | |
| 5,109,258 A | 4/1992 | Redwine | |
| 5,273,928 A | 12/1993 | Tani | |
| 5,432,117 A | 7/1995 | Yamamoto | |
| 5,444,001 A | 8/1995 | Tokuyama | |
| 5,478,765 A * | 12/1995 | Kwong et al. | 437/40 |
| 5,496,750 A | 3/1996 | Moslehi | |
| 5,543,648 A * | 8/1996 | Miyawaki | 257/347 |
| 5,631,189 A | 5/1997 | Kobayashi et al. | |
| 5,714,411 A | 2/1998 | Trahan et al. | |
| 5,714,413 A | 2/1998 | Brigham et al. | |
| 5,864,051 A | 1/1999 | Iwasawa et al. | |
| 5,923,994 A | 7/1999 | Motoyama | |
| 5,966,595 A | 10/1999 | Thakur et al. | |
| 5,976,931 A * | 11/1999 | Yew et al. | 438/255 |
| 5,985,714 A | 11/1999 | Sandhu et al. | |
| 6,017,809 A * | 1/2000 | Inumiya et al. | 438/585 |
| 6,022,789 A | 2/2000 | Takase | |
| 6,096,597 A | 8/2000 | Tsu et al. | |
| 6,153,507 A | 11/2000 | Mikagi | |
| 6,207,561 B1 * | 3/2001 | Hwang et al. | 438/660 |
| 6,221,788 B1 | 4/2001 | Kobayashi et al. | |
| 6,248,653 B1 | 6/2001 | Shirahata et al. | |
| 6,348,380 B1 | 2/2002 | Weimer et al. | |

OTHER PUBLICATIONS

U.S. patent application Pub. No. 2002/0030234 A1 to Ohuchi et al., published Mar. 14, 2002.

* cited by examiner

*Primary Examiner*—David Nelms
*Assistant Examiner*—Thinh Nguyen
(74) *Attorney, Agent, or Firm*—TraskBritt

(57) ABSTRACT

A method for conditioning or repairing a dielectric structure of a semiconductor device structure with selectivity over an adjacent conductive or semiconductive structure of the semiconductor device structure, such as a capacitor dielectric and an adjacent bottom electrode of the capacitor. The method includes exposing the dielectric structure and at least an adjacent surface of the conductive or semiconductive structure to an oxidizing atmosphere that includes at least one oxidant and hydrogen species. The at least one hydrogen species adsorbs to a surface of the conductive or semiconductive structure so as to substantially prevent passage of the at least one oxidant into or through the conductive or semiconductive structure. The oxidant oxidizes or repairs voids or other defects that may be present in the dielectric structure. Semiconductor device structures fabricated by employing the method are also disclosed.

20 Claims, 1 Drawing Sheet

USE OF SELECTIVE OXIDATION CONDITIONS FOR DIELECTRIC CONDITIONING

CROSS-REFERENCE TO RELATED APPLICATION

This application is a divisional of application Ser. No. 09/652,751, filed Aug. 31, 2000, pending.

BACKGROUND OF THE INVENTION

1. Field of the Invention

The present invention relates to methods for conditioning or reoxidizing dielectric layers of semiconductor device structures without substantially oxidizing conductive or semiconductive structures adjacent thereto. Particularly, the present invention relates to methods for conditioning or reoxidizing capacitor dielectric layers without substantially oxidizing the materials of adjacent capacitor electrodes.

2. State of the Art

In state of the art semiconductor devices, capacitors typically include a bottom electrode having a relatively large surface area, a dielectric layer formed over the bottom electrode, and an upper electrode formed over the dielectric layer. FIG. 1 illustrates an exemplary semiconductor device capacitor 10, formed over and in contact with an active device region 14 of a semiconductor substrate 12. Capacitor 10 includes a bottom electrode 16 formed over and in contact with the active device region 14, a dielectric layer 18 positioned over the bottom electrode 16, and an upper electrode 20 positioned over the dielectric layer 18.

After the bottom electrode 16 and capacitor dielectric 18 layers of the capacitor 10 have been formed, these layers and various other structures may be patterned in accordance with a particular integrated circuit design. Among the processes that are employed to effect such patterning, dry etch processes, including plasma etches, may be used. Nonetheless, plasma etches tend to cause considerable damage to the dielectric layer 18. Such damage may result regardless of efforts to optimize etch selectivity and optical end point measurement techniques. Aside from physical thinning and possibly creating voids or other defects in the dielectric layer 18, plasma etching may damage oxide bonds, creating charge trap sites, such as dangling silicon bonds when polysilicon is employed as the bottom electrode 16. The presence of voids, other defects, and charge trap sites in the dielectric layer 18 may diminish the desired dielectric properties of the dielectric layer 18 and, thus, the capacitance of the finished capacitor 10. Accordingly, this damage should be repaired to improve the quality and life expectancy of the dielectric layer 18 and of the capacitor 10. An oxidation or reoxidation step is commonly used to repair the dielectric layers.

As the dimensions of semiconductor device structures, including the thicknesses of capacitor dielectric layers, are ever decreasing, materials with greater dielectric constants are being used with increased frequency. These dielectric materials, like tantalum pentoxide ($Ta_2O_5$) and barium strontium titanate (BST), are typically deposited and annealed at temperatures near 600° C. and in the presence of high oxygen partial pressure. Nonetheless, voids, defects, and charge trap sites may be present in the extremely thin capacitor dielectric layers formed with such materials. Thus, conditioning by oxidizing or reoxidizing of dielectric layers formed with these materials may be necessary to fabricate a capacitor with the desired electrical properties. Conditioning can involve wet oxidation at temperatures above 900° C. for a relatively long period of time (e.g., up to about 30 minutes). During oxidation at such high temperatures, the dielectric layer 18 is typically thickened.

Unfortunately, conditions during oxidation also result in oxidation of the underlying materials, including portions of the bottom electrode 16. The longer the oxidation process and the higher the temperature, the more metal, metal nitride and/or silicide are consumed. Such oxidation of the bottom electrode 16 further effectively thickens the dielectric layer 18, often undesirably changing the capacitance of the capacitor 10. In addition, some metals, such as tungsten, are so readily oxidized in such processes that these metals are effectively rendered impractical for use as the bottom electrodes in capacitors.

One commonly utilized solution to the problem of oxidizing a bottom electrode of a capacitor structure during conditioning of an overlying dielectric layer is to provide an oxidation barrier layer between the bottom electrode and the overlying dielectric layer. However, there are a limited number of oxidation barrier materials which are conductive.

Processes are also known for oxidizing silicon with selectivity over adjacent structures formed from tungsten or tungsten nitride.

The inventors are not aware of any art that teaches conditioning of a dielectric layer of a capacitor structure by selective oxidization of the dielectric layer without substantially oxidizing an adjacent, underlying bottom electrode layer.

BRIEF SUMMARY OF THE INVENTION

In accordance with one aspect of the present invention, a method is provided for selectively oxidizing a dielectric layer of a structure without substantially oxidizing an adjacent conductive or semiconductive layer or structure. The inventive method includes exposing at least a portion of the dielectric oxidizing the electronic device by exposing the layer or structure to a selective oxidation atmosphere. The selective oxidation growth ambient selectively oxidizes or reoxidizes the dielectric layer or structure without the bottom electrode.

Another embodiment of the method of the present invention provides a method for conditioning a dielectric layer or structure by repairing voids or other defects in the dielectric layer or structure. Such a method includes forming a dielectric layer above a bottom electrode of a capacitor structure, exposing the bottom electrode to hydrogen species, and oxidizing the dielectric layer. The adsorption of the hydrogen species to a surface of the bottom electrode, substantially prevents oxidation of the bottom electrode, making the oxidation process selective for the dielectric layer.

A further embodiment of the method of the present invention includes forming a capacitor structure, which method includes a bottom electrode, forming at least one dielectric layer above the bottom electrode, adsorbing a hydrogen species on a surface of the bottom electrode, and oxidizing said at least one dielectric layer. Again, the adsorption of hydrogen species to a surface of the bottom electrode makes oxidation of the dielectric layer selective for the dielectric layer.

The present invention also includes a semiconductor device structure with a conductive or semiconductive structure adjacent to the dielectric structure. A hydrogen species is at least adsorbed to a portion of a surface of the conductive or semiconductive structure in contact with the dielectric structure. In an intermediate state, the dielectric structure may include voids, other defects, or charge traps. In a subsequently formed intermediate structure, the dielectric structure of the semiconductor device structure may be substantially free of voids, other defects, and charge traps while the hydrogen species remain present at least at an interface between the dielectric structure and the adjacent conductive or semiconductive structure.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

In the drawings, which illustrate exemplary embodiments of the present invention.

DETAILED DESCRIPTION OF THE INVENTION

The illustrated embodiments provide a method of minimizing oxidation of conductors in integrated circuits. Although the illustrated and disclosed embodiment is described in terms of a method for conditioning a capacitor structure for use in a semiconductor device, the skilled artisan will readily appreciate that the methods described herein will also have application to methods for conditioning or selectively oxidizing other types of dielectric structures without substantially oxidizing the material or materials of conductive or semiconductive structures adjacent to the dielectric structures.

Figure 1:
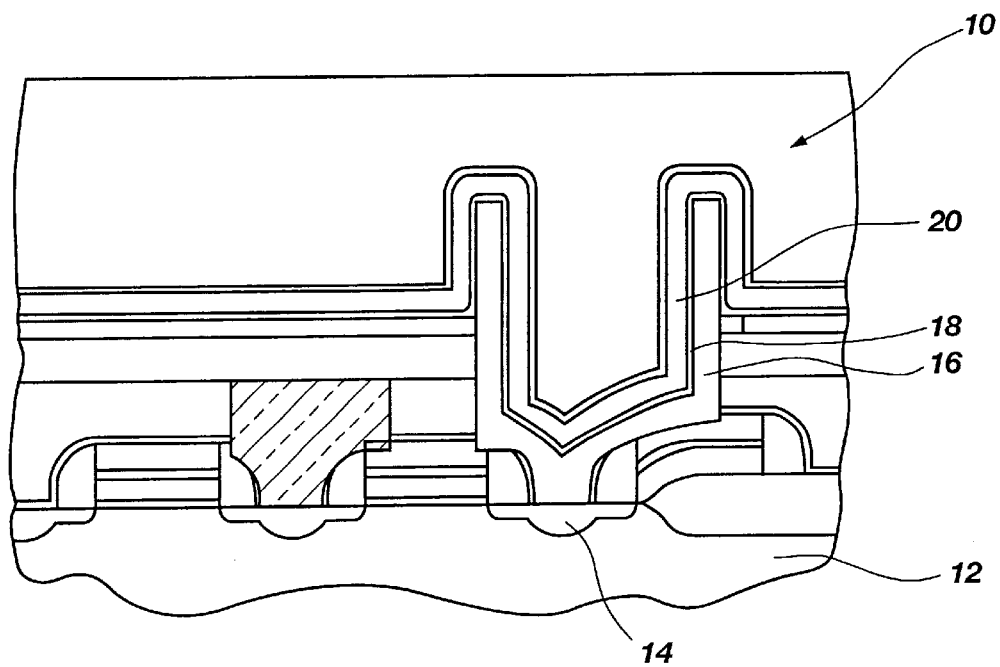
FIG. 1 is a cross-sectional representation of a conventional semiconductor device capacitor structure.
Figure 2:
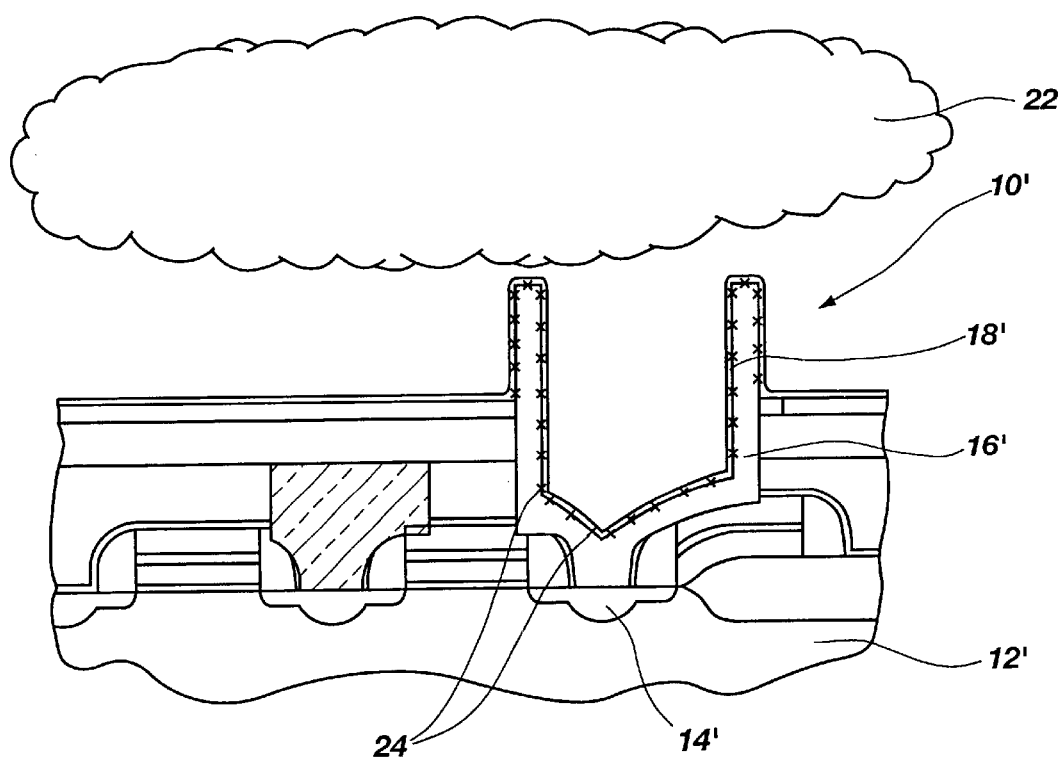
FIG. 2 is a cross-sectional schematic representation of use of the method of the present invention to selectively oxidize a dielectric structure of a semiconductor device structure without substantially oxidizing an adjacent conductive or semiconductive structure.

With reference to FIG. 2, an intermediate capacitor structure 10' is illustrated. Structure 10' is part of a semiconductor device structure that includes a semiconductor substrate 12' with conductively doped active device regions 14' formed therein. Capacitor structure 10' includes a bottom electrode 16' partially formed over and in electrical communication with an active device region 14'. Capacitor structure 10' also includes a dielectric layer 18' formed over and in contact with the bottom electrode 16'. The capacitor structure 10' may also include additional conductive or insulative layers (not shown).

Bottom electrode 16' of capacitor structure 10' may be formed from any conductive material that is suitable for use in a capacitor of a semiconductor device. In effecting the selective oxidation method of the present invention, it is preferred that bottom electrode 16' be formed from a conductive material such as ruthenium, ruthenium oxide, platinum, titanium nitride, tungsten, tungsten nitride, cobalt, or polysilicon. Alternatively, bottom electrode 16' may be formed from any conductive, metallic catalyst for ammonia combustion.

The dielectric layer 18' of capacitor structure 10' may be formed from any dielectric material suitable for use in capacitors of semiconductor devices. Examples of high dielectric constant materials that are useful in forming dielectric layer 18' include, without limitation, tantalum pentoxide ($Ta_2O_5$), barium strontium titanate (BST), strontium titanate (ST), barium titanate (BT), lead zirconium titanate (PZT), and strontium bismuth tantalate (SBT). Dielectric layer 18' may also be formed from one or more silicon nitrides or silicon oxides.

As the dielectric layer 18' of the capacitor structure 10' may include voids, other defects, or charge trap sites that may reduce the dielectric properties of dielectric layer 18' and, thus, undesirably affect the capacitance of a capacitor including the dielectric layer 18', dielectric layer 18' is conditioned or repaired by oxidizing or reoxidizing the same. While conditioning or repairing a dielectric layer 18' in accordance with teachings of the present invention, an adjacent conductive or semiconductive structure, such as the bottom electrode 16' of capacitor structure 10', is not substantially oxidized and oxidants may actually be substantially prevented from traveling through the adjacent conductive or semiconductive structure.

A selective oxidation method according to the present invention includes exposing at least a portion of the dielectric layer 18' to an oxidizing atmosphere 22 that includes an oxidant and hydrogen species. The oxidizing atmosphere 22 may also include nitrogen species. While the hydrogen species 24 permeates or at least adsorbs to a surface of an adjacent conductive or semiconductive structure, such as the bottom electrode 16', so as to reduce and, thereby prevent, oxidation of the material of the adjacent conductive or semiconductive structure, the oxidant oxidizes the dielectric layer 18'. Accordingly, an oxidizing atmosphere 22 incorporating teachings of the present invention is said to selectively oxidize the dielectric layer 18'.

Exemplary oxidants that may be used in the oxidizing atmosphere 22 include, without limitation, water ($H_2O$), hydrogen peroxide ($H_2O_2$), carbon monoxide (CO), carbon dioxide ($CO_2$), nitric oxide (NO), and nitrous oxide ($N_2O$). It is preferred that the oxidant in the oxidizing atmosphere 22 be relatively nonreactive with the hydrogen species 24. As molecular oxygen ($O_2$) may react with the hydrogen species 24, it is preferred that molecular oxygen not be used as the oxidant of the oxidizing atmosphere 22.

The hydrogen species 24 of the oxidizing atmosphere 22 may be derived from ammonia ($NH_3$). It is preferred that ammonia be used in the oxidizing atmosphere 22 as a source for either the hydrogen species 24 or the nitrogen species when a conductive structure adjacent the conditioned dielectric layer 18' is formed from a conductive, metallic catalyst for ammonia combustion. A skilled artisan will readily recognize alternative species that may adsorb to the surface of a conductive or semiconductive structure adjacent a dielectric structure to be conditioned. Accordingly, the use of such alternative species in an oxidizing atmosphere 22 are also within the scope of the present invention.

In addition to preventing oxidation of a conductive or semiconductive structure adjacent to a conditioned dielectric structure, the hydrogen species may also prevent oxidants from passing through the conductive or semiconductive structure and, thus, from oxidizing other structures, such as active device region 14', opposite the conductive or semiconductive structure from the conditioned dielectric structure.

In effecting the method of the present invention, the dielectric layer 18' or the portion thereof to be conditioned or reoxidized is exposed to an oxidizing atmosphere 22 according to the present invention in the presence of heat. For example, rapid thermal processing (RTP) may be employed to condition or repair the dielectric layer 18'. Exemplary rapid thermal process parameters include temperatures of from about 800° C. to about 1,100° C. and durations of about 20 seconds to about 4 minutes for a longer period. As another example of the manner in which selective oxidation may be effected in accordance with teachings of the present invention, an atmospheric furnace may be employed. When an atmospheric furnace is employed to effect the methods of the present invention, the oxidizing atmosphere 22, and at least the portion of the dielectric layer 18' to be conditioned or repaired, is exposed to a temperature of from about 650° C. to about 950° C. for up to about 3 hours.

As an example of the manner in which the oxidizing atmosphere 22 may be introduced into the presence of the dielectric layer, the volumetric ratio of the hydrogen-containing species (e.g., $H_2$ or $NH_3$) to the oxidant may be about 1:1 to about 200:1 and is preferably about 2:1 to about 10:1. The hydrogen species flow rates may be between about 1,000 sccm and 10,000 sccm and, preferably, between about 2,000 sccm and 7,000 sccm. Water vapor may be flowed at a rate of between about 50 sccm and 2,000 sccm. The oxidizing atmosphere 22 may have a pressure of about 250 mTorr to about 50 atm. and, preferably, of between about 350 Torr and 1,000 Torr.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention as disclosed herein which fall within the meaning and scope of the claims are to be embraced thereby.

What is claimed is:

1. A semiconductor device structure, comprising:
   a first structure comprising conductive or semiconductive material;
   at least one hydrogen species adhered to a surface of said first structure; and
   a second structure comprising dielectric material in contact with said surface of said first structure.

2. The semiconductor device structure of claim 1, wherein said first structure comprises a bottom electrode of a capacitor structure.

3. The semiconductor device structure of claim 1, wherein said second structure comprises a dielectric layer of a capacitor structure.

4. The semiconductor device structure of claim 1, wherein said second structure is substantially free of voids and defects.

5. The semiconductor device structure of claim 1, wherein said first structure comprises at least one of ruthenium, ruthenium oxide, platinum, titanium nitride, tungsten, tungsten nitride, cobalt, and polysilicon.

6. The semiconductor device structure of claim 1, wherein said first structure comprises a metallic catalyst for ammonia combustion.

7. The semiconductor device structure of claim 1, wherein said second structure comprises at least one of $Ta_2O_5$, barium strontium titanate, a silicon nitride, and a silicon oxide.

8. The semiconductor device structure of claim 1, wherein said at least one hydrogen species is configured to substantially prevent an oxidant from diffusing into or through said first structure.

9. A selective oxidation environment, comprising an oxidizing atmosphere comprising an oxidant and at least one hydrogen species, said oxidizing atmosphere proximate a semiconductor device comprising a conductive or semiconductive layer underlying a dielectric material, said at least one hydrogen species adhered to an interface surface between said conductive or semiconductive layer and said dielectric material.

10. The selective oxidation environment of claim 9, wherein said oxidizing atmosphere further comprises a nitrogen species.

11. The selective oxidation environment of claim 9, wherein said oxidizing atmosphere is at least partially derived from ammonia.

12. The selective oxidation environment of claim 11, wherein said conductive or semiconductive layer comprises a metallic catalyst for ammonia combustion.

13. The selective oxidation environment of claim 9, wherein said oxidant comprises at least one of $H_2O$, $H_2O_2$, $CO$, $CO_2$, $NO$ and $N_2O$.

14. The selective oxidation environment of claim 9, wherein said conductive or semiconductive layer comprises a bottom electrode of a capacitor structure.

15. The selective oxidation environment of claim 9, wherein said dielectric material comprises a dielectric layer of a capacitor structure.

16. The selective oxidation environment of claim 9, wherein said dielectric material is substantially free of voids and defects.

17. The selective oxidation environment of claim 9, wherein said conductive or semiconductive layer comprises at least one of ruthenium, ruthenium oxide, platinum, titanium nitride, tungsten, tungsten nitride, cobalt, and polysilicon.

18. The selective oxidation environment of claim 9, wherein said conductive or semiconductive layer comprises a metallic catalyst for ammonia combustion.

19. The selective oxidation environment of claim 9, wherein said dielectric material comprises at least one of $Ta_2O_5$, barium strontium titanate, a silicon nitride, and a silicon oxide.

20. The selective oxidation environment of claim 9, wherein said at least one hydrogen species is configured to substantially prevent said oxidant from diffusing into or through said conductive or semiconductive layer.

* * * * *

UNITED STATES PATENT AND TRADEMARK OFFICE
CERTIFICATE OF CORRECTION

PATENT NO. : 6,576,979 B2
DATED : June 10, 2003
INVENTOR(S) : Ronald A. Weimer and Don Carl Powell It is certified that error appears in the above-identified patent and that said Letters Patent is hereby corrected as shown below:

Column 1,
Lines 33-34, change "capacitor dielectric 18 layers" to -- dielectric layer 18 --

Signed and Sealed this

Eighteenth Day of November, 2003

JAMES E. ROGAN
*Director of the United States Patent and Trademark Office*